United States Patent
Liu et al.

(10) Patent No.: US 6,334,404 B1
(45) Date of Patent: Jan. 1, 2002

(54) METHOD AND APPARATUS FOR REDUCING PARTICLE CONTAMINATION ON WAFERS

(75) Inventors: Tien-Jui Liu, Lung-Ching Hsiang; Ling-Hsin Tseng, Hsin-Pu Chen, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/314,631

(22) Filed: May 19, 1999

(51) Int. Cl.[7] ............................................... C23C 16/00
(52) U.S. Cl. ..................... 118/723 R; 118/729; 118/500
(58) Field of Search ................................. 118/728, 724, 118/725, 500, 723 R, 729

(56) References Cited

U.S. PATENT DOCUMENTS 4,962,727 A * 10/1990 Harada ........................ 118/723
5,102,496 A * 4/1992 Savas ........................... 156/643
5,565,179 A * 10/1996 Douglas ................ 422/186.05
6,045,619 A * 4/2000 Tai et al. ..................... 118/724

\* cited by examiner

*Primary Examiner*—Richard Bueker
(74) *Attorney, Agent, or Firm*—Bacon & Thomas

(57) ABSTRACT

A method and apparatus for reducing particle contamination on wafers is disclosed. The method includes providing a semiconductor furnace system having an ideal reaction chamber, an electrostatic generator, a conducting wire, and a conductive ring. Moreover, an insulating layer is coated over the entire wafer boat carrier, that is part of the reaction chamber. Charges with a first polarity are generated after a reaction process carried out inside the chamber and before the "vacuum breaking" stage. These charges spread evenly across the entire exposed surface of the wafer boat carrier and repulse particles carrying the same polarity away from the wafers that are in process.

16 Claims, 2 Drawing Sheets

METHOD AND APPARATUS FOR REDUCING PARTICLE CONTAMINATION ON WAFERS

BACKGROUND OF THE INVENTION

1. Field of the Invention

The present invention generally relates to a method and apparatus for semiconductor processing, and more particularly, relates to a method and apparatus for reducing particle contamination on wafers within a semiconductor processing chamber.

2. Description of the Prior Art

A reaction chamber is a cornerstone of the semiconductor manufacturing process. Common processes such as oxidation, diffusion, deposition, and annealing are performed within a chamber.

In a reaction chamber that is used during a semiconductor process, a risen of dust occurs due to switches between different inflow gases and or changes in the inflow rate. The dust produced mainly comes from the following situations. First of all, after a long period of chamber usage and under a numerous cycle of temperature rising and falling within the chamber. Particles are produced by peelings due to thermal reactions inside a tube, which is a component of the chamber. Moreover, particles can be generated as the remains of a reactant or a sub-product in the reaction of reacting gases, by the surrounding environment, by the processing equipment or by the handling of manufacturing personnel.

A large percentage of the yield losses can be contributed to contamination by the particles described in the above paragraph, which pollutes the wafers during a semiconductor process. A Typical problem and harmful effect caused by particle contamination on a wafer is the poor adhesion of deposited layers. Contamination of particles not only reduces the yield percentage and also downgrades the reliability of the devices been built. For instance, particle contamination can cause a device to fail by improper defined patterns, by creating unpredictable surface topology, by inducing leakage current through insulating layer, or otherwise reducing the device lifetime.

It is generally recognized that a particle contamination exceeding one-half of a minimum feature size on a device has the potential of causing a fatal defect, a defect that might cause a total failure within a device. A defect of smaller size may also be fatal if it is located in a critical area, for instance, a particle contaminant in the gate oxide layer of a transistor.

The problem of particle contamination on wafers is particularly more serious for a LPCVD reaction chamber. After a serial step of reaction process within the LPCVD reaction chamber, the unreacted gases are drawn out till a very low pressure environment has been reached. Subsequently, a breaking up of the vacuum is introduced and an atmospheric pressure has been restored within the chamber. At the same time, turbulent flows are generated inside the chamber and an even greater dust movement has been risen within the LPCVD reaction chamber.

FIG. 1 shows in schematic form of a simplified conventional horizontal tube LPCVD reaction chamber 10. Providing a quartz tube 11 having two openings 12 and 13, where one of them is a gas inlet and the other is a gas outlet. In the drawing, depicting the gas inlet 12 and the gas outlet 13. The chamber 10 further comprises a wafer boat carrier 14 having a quartz gate 15 attached to it and a wafer boat 16 placed on top of the wafer boat carrier 14. Processing wafers 17 are placed inside the wafer boat 16. A turbulent flow 18 causes a risen of charged particles 19 within the quartz tube 11, a large portion of those charged particles will then been attracted to those wafers 17 in process. The result of this would be a contamination of particles on wafers.

It is therefore the main objective of the present invention is to provide a method and apparatus for reducing or even preventing particle contamination on wafers. Not only this, the present invention only requires a few addition of components to the existing processing equipment and it does not require the use of additional chemicals or gases.

SUMMARY OF THE INVENTION

In accordance with the present invention, an improved semiconductor furnace system having an electrostatic wafer boat carrier is provided for repulsing dust particles away from the wafers inside a reaction chamber that substantially reduces particle contamination on wafers in process. The idea of the present invention is applicable toward any type of semiconductor furnace system, including any CVD reactor and any PVD reactor. However, due to the simplicity in structure and drawing, FIG. 2 shows a preferred embodiment of the present invention, the main apparatus of an improved LPCVD system.

The improved LPCVD system that reduces particle contamination on wafers comprises a reaction chamber adapted to receive a reactant gas mixture from a gas inlet and having wafers to be processed. The reaction chamber itself comprises a quartz tube and a quartz gate attached to a wafer boat carrier. A dielectric layer formed and covering a surface of the wafer boat carrier. A numerous number of wafer boats located on top of the wafer boat carrier and having wafers placed inside the wafer boats.

Apart from the reaction chamber, the improved LPCVD system further comprises a few crucial components of the present invention, an electrostatic generator for producing either positive or negative charges, a conductive ring attached to the wafer boat carrier and outside the quartz tube. And a conducting wire linking in between the conductive ring and the electrostatic generator for transporting charges generated from the electrostatic generator to the wafer boat carrier.

The present invention is also directed to a method for reducing particle contamination on wafers in process. The method comprises an apparatus and an operating procedure. The apparatus required is the improved semiconductor furnace system, for example the improved LPCVD system described in the previous paragraph. The operating procedure comprises, providing the quartz gate attaches to the quartz tube and a process reaction takes place within the sealed tube. Next, turning on the electrostatic generator after a reacting process in generating a first polarity charge to repulse particles with the same polarity charge. FIG. 2 shows positive charges have been generated in repulsing positive particles away from the wafers. Sequentially, pulling out the wafer boat carrier from the quartz tube. And finally, turning off the electrostatic generator before removing the wafers away from the wafer boat carrier.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention provides a method and apparatus for reducing particle contamination on wafers in a semiconductor furnace system that is at least equipped with a reaction chamber and an electrostatic generator.

In illustrating the present invention, a low pressure chemical vapor deposition (LPCVD) reactor is used to exemplify a preferred embodiment of the present invention. LPCVD reactor is chosen to conveniently illustrate a method for the present invention due to its simplicity in structure and drawing. However, it should be understood that there is no way to limit the application of the present invention to any particular deposition process, such as any CVD reactor or any PVD reactor, just to name a few here.

Figure 1:
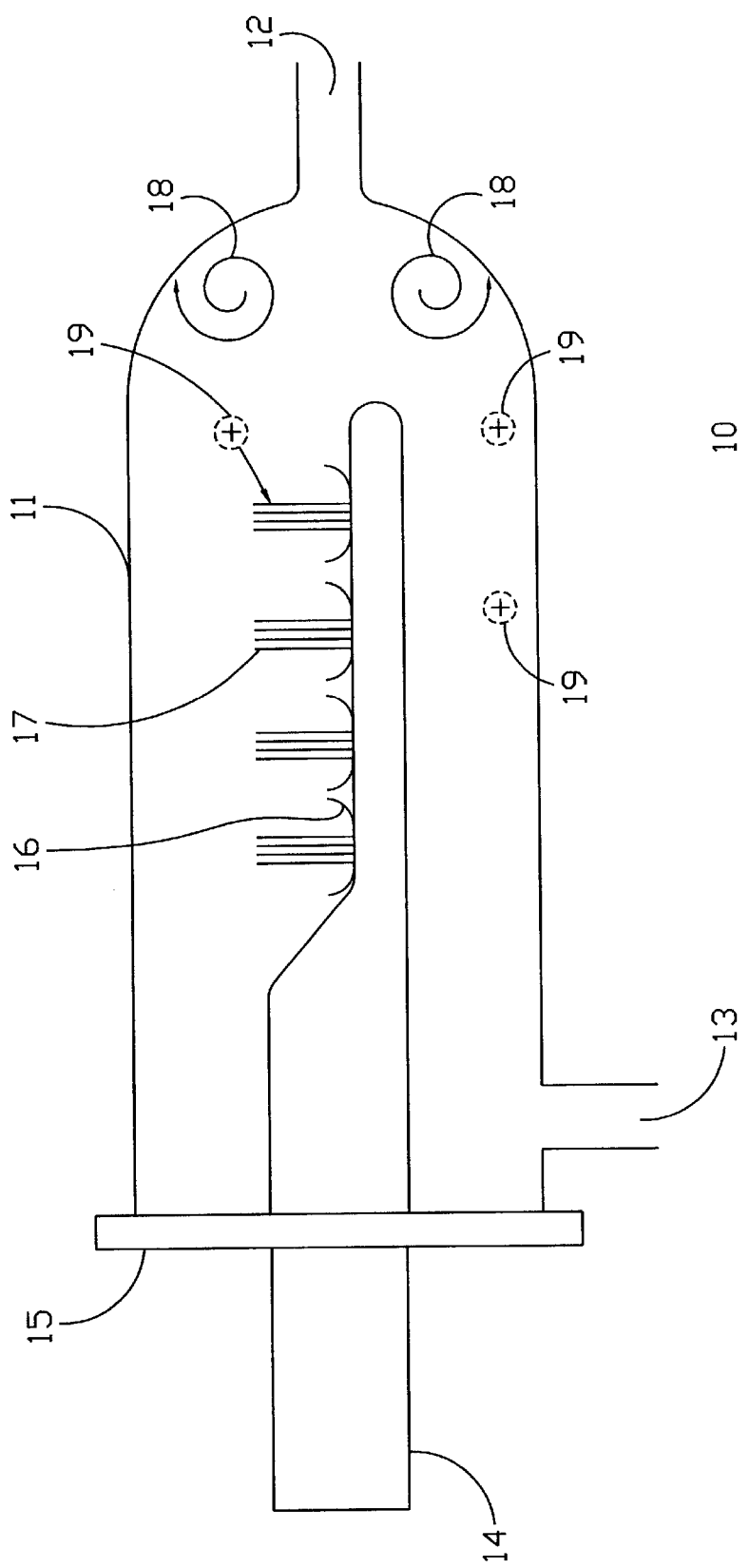
FIG. 1 is a schematic diagram illustrating the configuration of a simplified conventional horizontal tube LPCVD reaction chamber.
Figure 2:
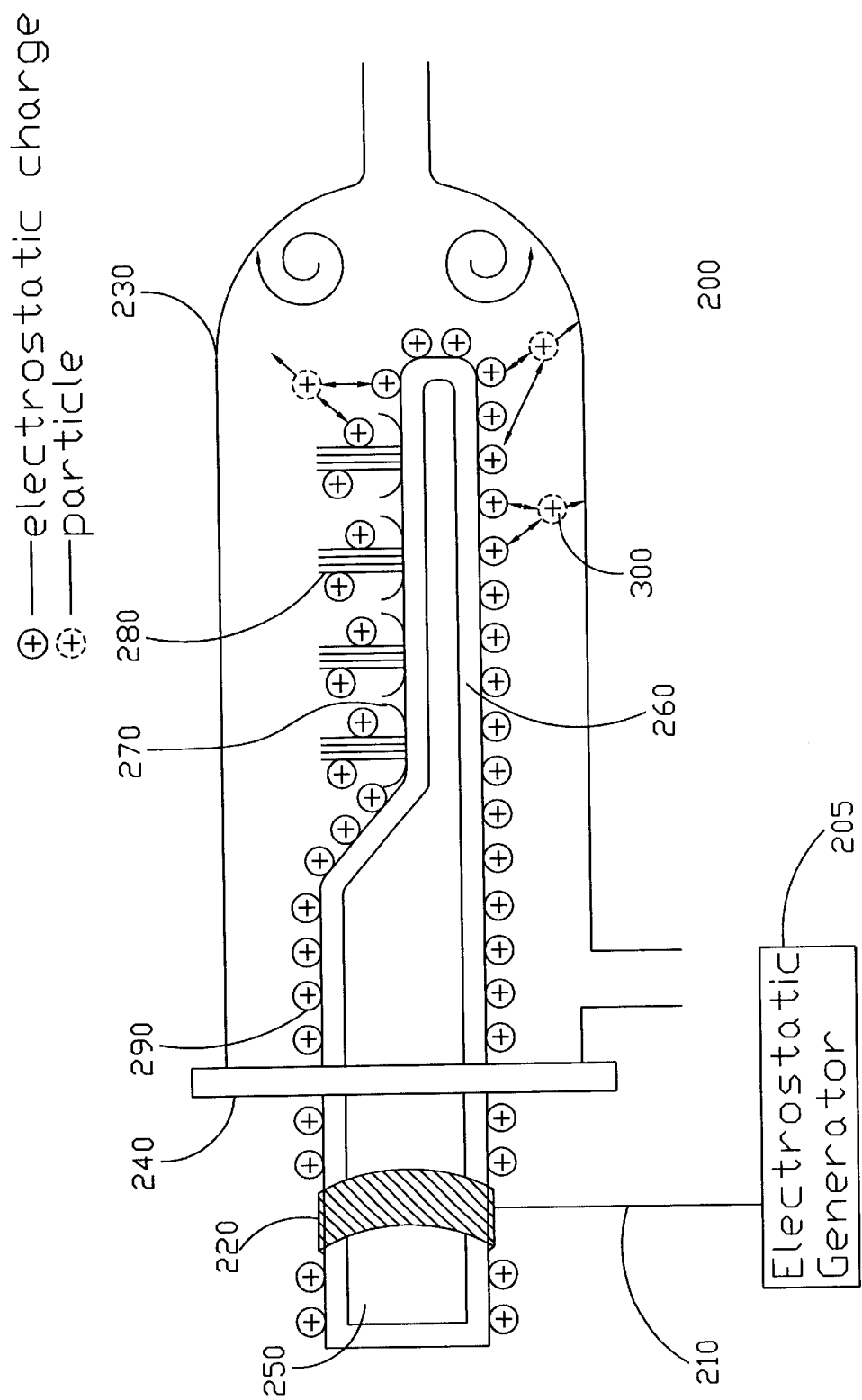
FIG. 2 is a schematic diagram illustrating the configuration of the present invention.

An improved LPCVD reaction chamber 200 is shown in FIG. 2 combining with an electrostatic generator 205, a conducting wire 210, and a conductive ring 220 to form an improved semiconductor furnace system that reduces particle contamination on wafers. The electrostatic generator 205 can be any generator that is on sell in the market, as long as it is capable in producing both positive and negative charges in order to repulse particles carrying charges with the same polarity. The conducting wire 210 and the conductive ring 220 are combined to serve as a transporting path for charges in between the electrostatic generator 205 and the chamber. The conductive ring can be made of any conductive material, whereas copper is used for the present invention.

The reaction chamber 200 itself comprises a quartz tube 230 and a quartz gate 240 attached to a wafer boat carrier 250. The quartz gate is used for the sealing purpose against the quartz tube during a deposition process, where it is perpendicularly attached to the wafer boat carrier through the center of itself. The wafer boat carrier 250 can be a paddle, if in horizontal direction, or a pedestal, if in vertical direction, no matter which, it consists of silicon carbide.

On a surface top of the wafer boat carrier 250, there forms an insulating layer 260 covering the entire wafer boat carrier. The insulating layer 260 is an oxide layer or more specifically a dielectric layer, which comprises silicon oxide. The main purpose for forming this particular layer is to provide a surface for the generated charges 290 to travel around on the wafer boat carrier. A numerous number of wafer boats 270 are located on top of the wafer boat carrier 250 and having the wafers 280 placed within the wafer boats.

A method for reducing particle contamination on wafers comprises an apparatus and an operating procedure. The apparatus required is the improved semiconductor furnace system shown in FIG. 2. The operating procedure comprises, providing the quartz gate 240 attaches to the quartz tube 230 and a deposition process takes place within the sealed tube.

Drawing out the unreacted gases for about 5 minutes after the end of the deposition process and before carrying on to the next step, that is turn on the electrostatic generator 205. Whether or not the unreacted gases have been drawn out completely can be judged from a pressure reading for the sealed tube.

Next, turns on the electrostatic generator 205 after the deposition process, charges with a first polarity are generated from the electrostatic generator 205 and been transported to the wafer boat carrier through the conducting wire 210 and the conductive ring 220. These charges have been spread evenly over the entire exposed surface of the carrier, the wafer boats 270, and also the wafers 280, the ideal role of these generated charges is to repulse particles carrying the same polarity charge. FIG. 2 shows positive charges 290 have been generated to repulse positive particles 300 away from the surfaces with electrostatic charges, in particular away from the wafers 280. The charge polarity of the particles is determined experimentally and it heavily depends on the process type, only one polarity can occur at a time within the sealed tube and under the same process type.

Sequentially, introducing nitrogen or argon gas into the sealed tube and making a pressure within that tube return back to an atmospheric pressure, the stage of "vacuum breaking" as it is called. Finally, pulling out the wafer boat carrier 250 from the quartz tube 230, and turning off the electrostatic generator 205 before removing the wafers 280 away from the wafer boat carrier.

Although specific embodiments have been illustrated and described, it will be obvious to those skilled in the art that various modifications may be made without departing from what is intended to be limited solely by the appended claims.

What is claimed is:

1. An improved semiconductor furnace system that reduces particle contamination on wafers, said system comprises:
   a reaction chamber adapted to receive a reactant gas mixture and a wafer to be processed, said reaction chamber comprises a tube and a disc structure attached to a wafer boat carrier;
   a dielectric layer formed covering at least a portion of a surface of said wafer boat carrier;
   a wafer boat positioned on top of said dielectric layer of said wafer boat carrier and having wafers placed within said wafer boat;
   an electrostatic generator for producing either positive or negative charges;
   a conductive ring attached to said dielectric layer of said wafer boat carrier and outside said tube;
   a conducting wire linking in between said conductive ring and said electrostatic generator for transporting said charges generated from said electrostatic generator to said dielectric layer of said wafer boat carrier.

2. The system according to claim 1, wherein said reaction chamber is selected from the group consisting of a CVD reaction chamber and a PVD reaction chamber.

3. The system according to claim 1, wherein said disc structure is comprised of quartz, which uses as a gate for sealing purpose against said tube.

4. The system according to claim 3, wherein said disc structure is perpendicularly attached to said wafer boat carrier through a center of said disc structure.

5. The system according to claim 1, wherein said tube is comprised of quartz.

6. The system according to claim 1, wherein said wafer boat carrier is selected from the group consisting of a paddle and a pedestal.

7. The system according to claim 1, wherein said insulating layer is selected from the group consisting of an oxide layer and a dielectric layer.

8. The system according to claim 7, wherein said insulating layer comprises silicon oxide.

9. The system according to claim 1, wherein said wafer boat is comprised of quartz.

10. The system according to claim 1, wherein said conductive ring comprises copper.

11. An improved wafer carrier comprises: providing a dielectric layer formed covering at least a portion of a surface of said wafer carrier;
   a wafer boat positioned on top of said dielectric layer of said wafer carrier and having wafers placed within said wafer boat; an electrostatic generator for producing either positive or negative charges;
   a conductive ring attached to said dielectric layer of said wafer carrier and outside a tube;
   a conducting wire linking in between said conductive ring and said electrostatic generator for transporting said charges generated from said electrostatic generator to said dielectric layer of said wafer carrier.

12. The wafer carrier according to claim 11, said wafer carrier is selected from the group consisting of a paddle and a pedestal.

13. The wafer carrier according to claim 11, wherein said insulating layer is selected from the group consisting of an oxide layer and a dielectric layer.

14. The wafer carrier according to claim 13, wherein said insulating layer comprises silicon oxide.

15. The wafer carrier according to claim 11, wherein said wafer boat is comprised of quartz.

16. The wafer carrier according to claim 11, wherein said conductive ring comprises copper.

* * * * *